United States Patent
Tsai et al.

(10) Patent No.: US 10,284,190 B2
(45) Date of Patent: May 7, 2019

(54) VOLTAGE DETECTOR CIRCUITS AND METHODS

(71) Applicant: TAIWAN SEMICONDUCTOR MANUFACTURING COMPANY, LTD., Hsinchu (TW)

(72) Inventors: Ming-Fu Tsai, Hsinchu (TW); Jen-Chou Tseng, Jhudong Township (TW); Kuo-Ji Chen, Taipei County (TW); Tzu-Heng Chang, New Taipei (TW)

(73) Assignee: TAIWAN SEMICONDUTOR MANUFACTURING COMPANY, LTD., Hsinchu (TW)

( * ) Notice: Subject to any disclaimer, the term of this patent is extended or adjusted under 35 U.S.C. 154(b) by 64 days.

(21) Appl. No.: 15/450,330

(22) Filed: Mar. 6, 2017

(65) Prior Publication Data
US 2017/0346479 A1    Nov. 30, 2017

Related U.S. Application Data

(63) Continuation of application No. 15/167,149, filed on May 27, 2016, now Pat. No. 9,608,616.

(51) Int. Cl.
*H03K 17/0814* (2006.01)
*H03K 5/08* (2006.01)
*H03K 19/003* (2006.01)

(52) U.S. Cl.
CPC ......... *H03K 17/08142* (2013.01); *H03K 5/08* (2013.01); *H03K 19/00315* (2013.01)

(58) Field of Classification Search
USPC .................................. 327/318, 321
See application file for complete search history.

(56) References Cited

U.S. PATENT DOCUMENTS

| | | | |
|---|---|---|---|
| 6,169,439 B1 * | 1/2001 | Teggatz | H03K 17/0822 327/309 |
| 6,310,379 B1 * | 10/2001 | Andresen | H01L 27/0277 257/355 |
| 7,594,198 B2 | 9/2009 | Chen | |
| 8,324,658 B2 | 12/2012 | Tsai et al. | |
| 8,334,571 B2 | 12/2012 | Tsai et al. | |
| 8,541,848 B2 | 9/2013 | Huang et al. | |
| 8,730,626 B2 | 5/2014 | Tseng et al. | |
| 8,743,515 B2 | 6/2014 | Yang et al. | |
| 8,759,871 B2 | 6/2014 | Song et al. | |
| 8,760,828 B2 | 6/2014 | Ma | |
| 8,792,218 B2 | 7/2014 | Tsai | |
| 8,854,778 B2 | 10/2014 | Chu et al. | |
| 8,867,183 B2 | 10/2014 | Chen et al. | |
| 9,035,393 B2 | 5/2015 | Ma et al. | |
| 9,048,655 B2 | 6/2015 | Meng et al. | |
| 9,069,924 B2 | 6/2015 | Chen | |
| 9,117,677 B2 | 8/2015 | Ma et al. | |
| 9,184,586 B2 | 11/2015 | Wang et al. | |

(Continued)

*Primary Examiner* — Adam D Houston
(74) *Attorney, Agent, or Firm* — Hauptman Ham, LLP

(57) ABSTRACT

A voltage detector includes a first node configured to have a first supply voltage, a second node configured to have a second supply voltage, and an output node. The voltage detector is configured to drive the output node to the first supply voltage in response to a difference between the first supply voltage and the second supply voltage exceeding a predetermined threshold voltage value.

20 Claims, 10 Drawing Sheets

(56) References Cited

U.S. PATENT DOCUMENTS

| | | | |
|---|---|---|---|
| 9,214,540 B2 | 12/2015 | Tsai et al. | |
| 9,608,616 B1* | 3/2017 | Tsai | H03K 17/08142 |
| 2006/0189189 A1* | 8/2006 | Jeon | H01L 27/0266 |
| | | | 439/248 |
| 2009/0086395 A1* | 4/2009 | Skrenes | H03K 5/08 |
| | | | 361/91.2 |
| 2009/0195946 A1* | 8/2009 | Kleveland | H01L 27/0251 |
| | | | 361/56 |
| 2009/0201616 A1* | 8/2009 | Moon | H01L 27/0285 |
| | | | 361/56 |
| 2010/0244912 A1* | 9/2010 | Chen | H03K 17/22 |
| | | | 327/143 |
| 2011/0080206 A1* | 4/2011 | Koch | G06F 13/4081 |
| | | | 327/437 |
| 2013/0119433 A1 | 5/2013 | Wang | |
| 2014/0118869 A1* | 5/2014 | Meng | H02H 9/043 |
| | | | 361/56 |
| 2014/0167106 A1* | 6/2014 | Salcedo | H01L 29/66378 |
| | | | 257/146 |
| 2014/0175611 A1 | 6/2014 | Hsu | |
| 2014/0195065 A1* | 7/2014 | Yang | H02M 3/33523 |
| | | | 700/298 |
| 2014/0217461 A1 | 8/2014 | Song et al. | |
| 2014/0226241 A1 | 8/2014 | Tseng et al. | |
| 2014/0246979 A1* | 9/2014 | Zhang | H05B 33/0815 |
| | | | 315/122 |
| 2014/0253008 A1* | 9/2014 | Sykes | H02H 3/24 |
| | | | 318/494 |
| 2014/0268464 A1* | 9/2014 | Dai | H02M 1/32 |
| | | | 361/91.1 |
| 2014/0307355 A1 | 10/2014 | Tsai et al. | |
| 2014/0355157 A1* | 12/2014 | Huang | H02H 9/046 |
| | | | 361/56 |
| 2014/0376138 A1* | 12/2014 | Kim | H02H 9/04 |
| | | | 361/86 |
| 2015/0062761 A1* | 3/2015 | Chen | H03K 3/013 |
| | | | 361/56 |
| 2015/0130533 A1* | 5/2015 | Jeon | H02J 9/061 |
| | | | 327/540 |
| 2016/0285257 A1* | 9/2016 | Tsaur | H02H 9/046 |
| 2016/0314390 A1* | 10/2016 | Wu | G06K 19/0709 |
| 2017/0346274 A1* | 11/2017 | Nakahara | H03K 17/0822 |
| 2017/0373603 A1* | 12/2017 | Basso | H02H 3/20 |
| 2018/0083443 A1* | 3/2018 | Mertens | H02H 9/046 |
| 2018/0139811 A1* | 5/2018 | Ekbote | H05B 33/0815 |
| 2018/0145676 A1* | 5/2018 | Tran | H03K 17/0828 |
| 2018/0326925 A1* | 11/2018 | Konishi | B60R 16/02 |

* cited by examiner

US 10,284,190 B2

VOLTAGE DETECTOR CIRCUITS AND METHODS

PRIORITY CLAIM

The present application is a continuation of U.S. application Ser. No. 15/167,149, filed May 27, 2016, which is incorporated herein by reference in its entirety.

BACKGROUND

Integrated circuits (ICs) are potentially exposed to electrical over-stress (EOS) events from power surges and other sources that can impact circuit reliability. During EOS events, voltage levels on conductors, or nodes, used to deliver power to circuits are substantially higher than normal voltage levels, so circuit components can be damaged. EOS concerns increase as IC dimensions shrink due to the increased vulnerability of thin oxides and low junction breakdown voltages.

Compared to transient electrostatic discharge (ESD) events with fast rise times and short durations, EOS events have slower rise times, higher energies, and/or wider ranges of pulse widths. Protecting circuits from EOS events therefore entails approaches that can differ from those used for ESD events. In most cases, ESD protection circuits are built on an IC chip to address ESD threats within all manufacturing and packaging processes, while some discrete EOS or system ESD protection elements are located outside the chip.

An EOS circuit is provided in some prior approaches by diode strings that protect sensitive circuit elements during EOS events but allow significant leakage currents during normal circuit operation. Polysilicon diodes used in some approaches need to be large to avoid significant heat generation during an EOS event.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1:
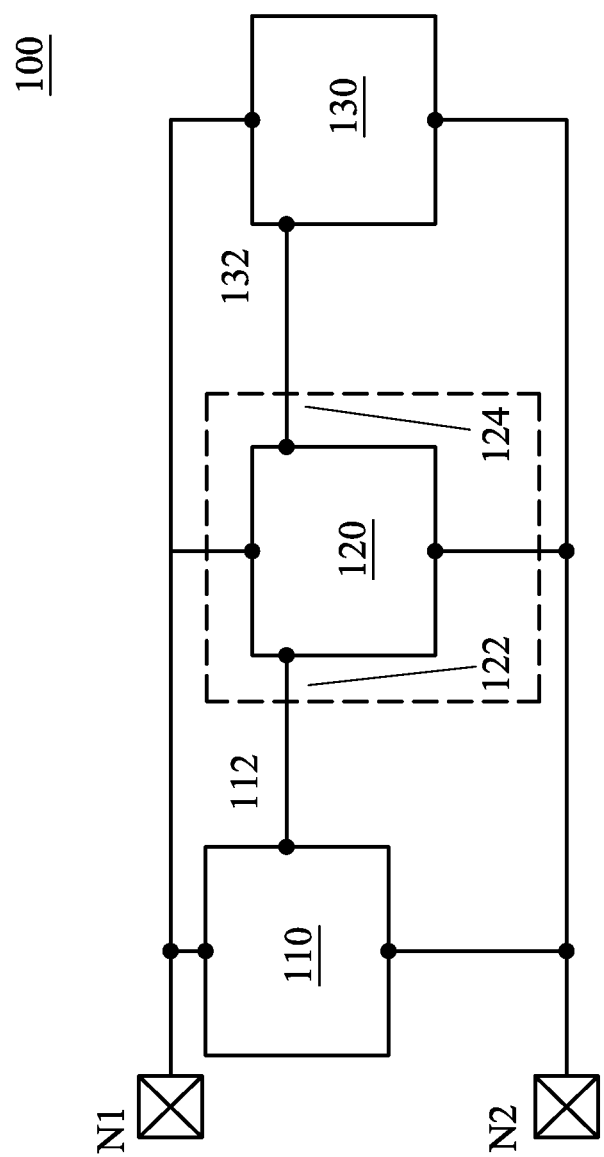
FIG. 1 is a diagram of a power clamp circuit, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

In various embodiments, a power clamp circuit responds to a detected EOS event by establishing a local current path between a first power node and a second power node. The local current path acts as a power clamp, thereby protecting other circuits connected to the power nodes from full exposure to the energy delivered by the EOS event.

In various embodiments, a power clamp circuit includes a first node configured to have a first supply voltage and a second node configured to have a second supply voltage. A voltage detector, including a first output node, and a clamp circuit are coupled between the first node and the second node. The voltage detector is configured to output a first voltage value to the first output node in response to a difference between the first supply voltage and the second supply voltage exceeding a predetermined threshold voltage value, and the clamp circuit is configured to establish a conduction path between the first node and the second node in response to the first voltage value. In some embodiments, a drive circuit coupled between the first node and the second node is configured to receive the first voltage value and output a control voltage to the clamp circuit.

In some embodiments, a transient detector including a second output node is also coupled between the first node and the second node. The transient detector is configured to output a second voltage value to the second output node in response to a transient difference between the slopes of rising edges of the first supply voltage and the second supply voltage exceeding a predetermined threshold change value. The drive circuit is configured to output the control voltage to the clamp circuit in response to the first voltage value and the second voltage value.

FIG. 1 is a diagram of a power clamp circuit 100, in accordance with some embodiments. Power clamp circuit 100 comprises a first supply node N1 and a second supply node N2. A voltage detector 110, a drive circuit 120, and a clamp circuit 130 are coupled in parallel between first node N1 and second node N2. In some embodiments, an output node 112 of voltage detector 110 is coupled with an input node 122 of drive circuit 120, and an output node 124 of drive circuit 120 is coupled with an input node 132 of clamp circuit 130. In some embodiments, drive circuit 120 is not present and output node 112 of voltage detector is coupled with input node 132 of clamp circuit 130.

In some embodiments, the components of power clamp circuit 100, including voltage detector 110, clamp circuit 130, and, if present, drive circuit 120, are components of a single IC chip.

First supply node N1 is configured to have a first supply voltage. In steady state operation, the first supply voltage has a first direct current (DC) voltage value. In some embodiments, the first DC voltage value is VDD of a functional circuit (not shown) coupled with first supply node N1. In some embodiments, the first DC voltage value is a VDD value of 1.8V. In some embodiments, the first DC voltage value is a VDD value of 0.8V. In various embodiments, a functional circuit coupled with first supply node N1 is a telecommunication, audio, processor, memory, power electronic system, application specific integrated circuit (ASIC), universal serial bus (USB) or other type interface, logic, signal processing, or similar type of circuit. In some embodiments, the functional circuit and power clamp circuit 100 are components of the same IC chip.

Second supply node N2 is configured to have a second supply voltage. In steady state operation, the second supply voltage has a second DC voltage value different from the first DC voltage value. In some embodiments, the second DC voltage value is VSS of a functional circuit coupled with first supply node N1 and second supply node N2. In some embodiments, the second DC voltage value is a ground reference voltage of a functional circuit coupled with first supply node N1 and second supply node N2.

In some embodiments, a first DC voltage value and/or a second DC voltage value include one or more non-DC voltage components, but would be understood by a person of ordinary skill in the art as being effectively DC voltages. For example, one or both of a first DC voltage value and a second DC voltage value can include an alternating current (AC) noise signal having a magnitude significantly smaller than the DC component of the first DC voltage value or the second DC voltage value.

Voltage detector 110 is configured to detect a difference between the first supply voltage on first supply node N1 and the second supply voltage on second supply node N2 in comparison with a predetermined threshold voltage value. Voltage detector 110 is configured to output an output voltage on output node 112 based on the comparison between the difference and the predetermined threshold voltage value. If the difference between the first supply voltage and the second supply voltage is less than or equal to the predetermined threshold voltage value, voltage detector 110 is configured to output a first output voltage value to output node 112. If the difference between the first supply voltage and the second supply voltage exceeds the predetermined threshold voltage value, voltage detector 110 is configured to output a second output voltage value to output node 112 different from the first output voltage value.

For an application of power clamp circuit 100 having a nominal first DC voltage value and a nominal second DC voltage value during steady state operation, voltage detector 110 is configured to detect an EOS event by selecting a predetermined threshold voltage value larger than a difference between the nominal first DC voltage value and the nominal second DC voltage value. In operation, during a normal steady state or while normally powering up or powering down to/from steady state, the difference between the first supply voltage value and the second supply voltage value is equal to or below the predetermined threshold voltage value, so voltage detector 110 outputs the first output voltage value. During an EOS event, in operation, the first supply voltage has a value relative to the second supply voltage that is above the predetermined threshold voltage value, so voltage detector 110 outputs the second output voltage value.

In some embodiments, the first output voltage value represents a first logic value, e.g., high or low, and the second output voltage value represents a second logic value, e.g., low or high. In some embodiments, voltage detector 110 is configured to generate one of the first output voltage value or the second output voltage value by driving output node 112 to one of the first supply voltage or the second supply voltage. In some embodiments, voltage detector 110 is configured to generate either the first output voltage value or the second output voltage value by driving output node 112 to one of the first supply voltage or the second supply voltage, and to generate the other of the first output voltage value or the second output voltage value by driving output node 112 to the other one of the first supply voltage or the second supply voltage.

Non-limiting examples of circuits usable as voltage detector 110 are discussed below with respect to FIG. 3.

Drive circuit 120 is configured to receive the output voltage from node 112, generate an output voltage in response to the output voltage from node 112, and output the output voltage to output node 124. To output the output voltage, drive circuit 120 is configured to output current sufficient to drive a load presented at input node 132 of clamp circuit 130 so that the load has the output voltage within a predetermined amount of time. In some embodiments, the load is a capacitive load associated with a gate terminal of a transistor of clamp circuit 130, and the current sufficient to drive the load is based on a switching time of the transistor.

In some embodiments, generating the output voltage comprises generating the output voltage having a logic value opposite a logic value of the output voltage from node 112. In some embodiments, drive circuit 120 includes an inverter configured to generate an output voltage having a logic value opposite a logic value of the output voltage from node 112. In some embodiments, drive circuit 120 includes one or more output nodes (not shown) in addition to output node 124. A non-limiting example of a circuit usable as drive circuit 120 is discussed below with respect to circuit 400A and FIG. 4.

Clamp circuit 130 is configured to receive a control voltage and selectively establish a current path between first supply node N1 and second supply node N2. Clamp circuit 130 is configured to establish the current path in response to the control voltage having a first control voltage value and to not establish the current path in response to the control voltage having a second control voltage value.

Input node 132 of clamp circuit 130 is coupled with output node 124 of drive circuit 120 and the control voltage is the output voltage of drive circuit 120 on output node 124. In some embodiments, drive circuit 120 is not present, input node 132 of clamp circuit 130 is coupled with output node 112 of voltage detector 110, and the control voltage is the output voltage on output node 112.

In some embodiments, clamp circuit 130 includes a switch responsive to the control voltage. In some embodiments, the switch is an n-type metal oxide semiconductor (NMOS) transistor, a gate of the NMOS transistor is coupled with input node 132, and the current path includes a channel of the NMOS transistor. In some embodiments, the switch is a p-type metal oxide semiconductor (PMOS) transistor, a gate of the PMOS transistor is coupled with input node 132, and the current path includes a channel of the PMOS transistor.

In some embodiments, clamp circuit 130 includes one or more input nodes (not shown) in addition to input node 132. Non-limiting examples of circuits usable as clamp circuit 130 are discussed below with respect to FIG. 5.

Voltage detector 110, drive circuit 120, if present, and clamp circuit 130, are configured to establish a current path between first supply node N1 and second supply node N2 in response to a difference between the first supply voltage and the second supply voltage exceeding a predetermined threshold voltage value. Power clamp circuit 100 is thereby configured to, in operation, act as a voltage clamp in response to an EOS event such that the effect of the EOS on other circuits coupled with first supply node N1 and second supply node N2 is significantly reduced in comparison with prior approaches.

Figure 2:
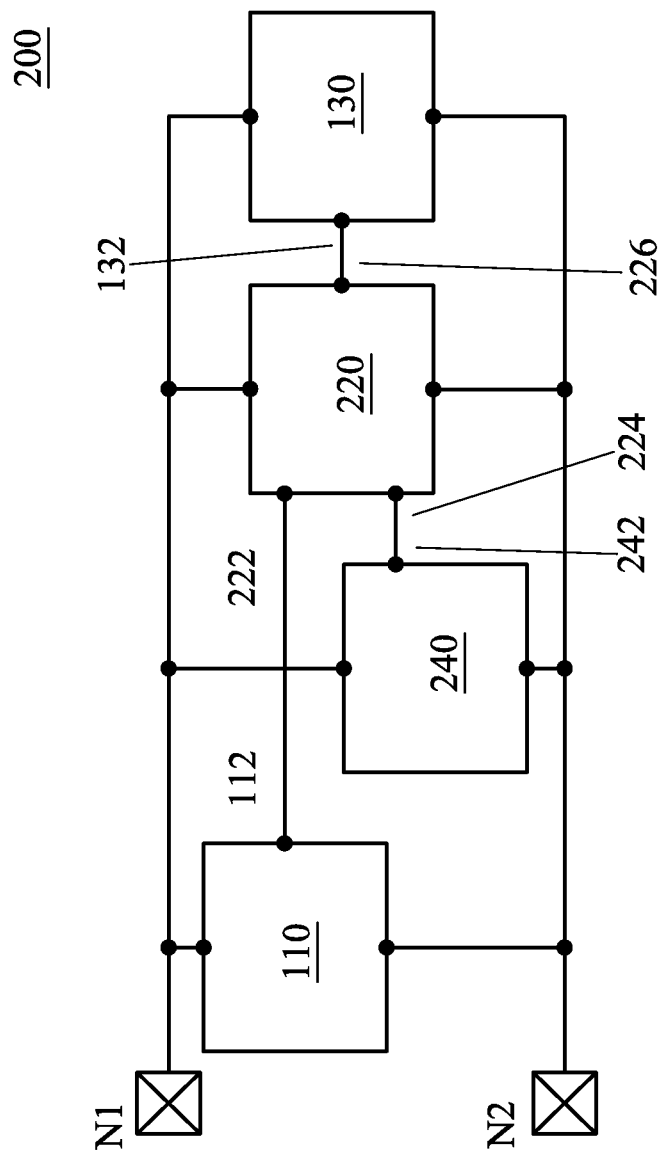
FIG. 2 is a diagram of a power clamp circuit, in accordance with some embodiments.

FIG. 2 is a diagram of a power clamp circuit 200, in accordance with some embodiments. Power clamp circuit 200 includes first supply node N1, second supply node N2, voltage detector 110, and clamp circuit 130, discussed above with respect to power clamp circuit 100. In contrast to power clamp circuit 100, power clamp circuit 200 does not include drive circuit 120. Power clamp circuit 200 also includes transient detector 240 and drive circuit 220 coupled in parallel between first supply node N1 and second supply node N2. Transient detector 240 includes an output node 242. Drive circuit 220 includes a first input node 222 coupled with output node 112 of voltage detector 110, a second input node 224 coupled with output node 242, and an output node 226 coupled with input node 132 of clamp circuit 130.

In some embodiments, the components of power clamp circuit 200, including voltage detector 110, clamp circuit 130, drive circuit 220, and transient detector 240, are components of a single IC chip. In some embodiments, power clamp circuit 200 and a functional circuit coupled with first supply node N1 and second supply node N2 are components of the same IC chip.

Transient detector 240 is configured to detect a rate of change of the difference between the first supply voltage on first supply node N1 and the second supply voltage on second supply node N2. Transient detector 240 is configured to output an output voltage on output node 242 based on the rate of change of the difference. If the rate of change of the difference between the first supply voltage and the second supply voltage remains equal to or below a predetermined threshold change value, transient detector 240 is configured to output a first output voltage value to output node 242. If the rate of change of the difference between the first supply voltage and the second supply voltage exceeds the predetermined threshold change value, transient detector 240 is configured to output a second output voltage value to output node 242 different from the first output voltage value.

By selecting a predetermined threshold change value larger than rates of change expected from normal operating conditions of functional circuits connected to supply node N1, transient detector 240 is configured to detect an ESD event. In operation, during transitional power on or off states, or during steady state, the rate of change of the difference between the first DC voltage value and the second DC voltage value is equal to or below the predetermined threshold change value, so transient detector 240 outputs the first output voltage value. During an ESD event, in operation, the rate of change of the first supply voltage relative to the second supply voltage exceeds the predetermined threshold change value, so transient detector 240 outputs the second output voltage value.

In some embodiments, the first output voltage value represents a first logic value, e.g., high or low, and the second output voltage value represents a second logic value, e.g., low or high. A non-limiting example of a circuit usable as transient detector 240 is discussed below with respect to FIG. 6.

Drive circuit 220 is configured to generate the control voltage and output the control voltage to output node 226 in response to both the output voltage on node 112 of voltage detector 110 and the output voltage on node 242 of transient detector 240. Drive circuit 220 is configured to generate the control voltage having the first control voltage value if either the output voltage value on node 112 corresponds to detection of the supply voltage difference being above the predetermined threshold voltage value or the output voltage value on node 242 corresponds to detection of the rate of change of the supply voltage difference exceeding the predetermined threshold change value. Drive circuit 220 is configured to generate the control voltage having the second control voltage value if neither the output voltage value on node 112 corresponds to detection of the supply voltage difference being above the predetermined threshold voltage value nor the output voltage value on node 242 corresponds to detection of the rate of change of the supply voltage difference exceeding the predetermined threshold change value.

In some embodiments, drive circuit 220 includes one or more output nodes (not shown) in addition to output node 226. Non-limiting examples of circuits usable as drive circuit 220 are discussed below with respect to circuit 400B, circuit 400C, and FIG. 4.

Voltage detector 110, transient detector 240, drive circuit 220, and clamp circuit 130 are configured to establish a current path between first supply node N1 and second supply node N2 in response to a difference between the first supply voltage and the second supply voltage exceeding a predetermined threshold voltage value or a rate of change of the difference between the first supply voltage and the second supply voltage exceeding a predetermined threshold change value. Power clamp circuit 200 is thereby configured to, in operation, act as a voltage clamp in response to both EOS and ESD events such that the effect on other circuits coupled with first supply node N1 and second supply node N2 is significantly reduced in comparison with prior approaches.

Figure 3:
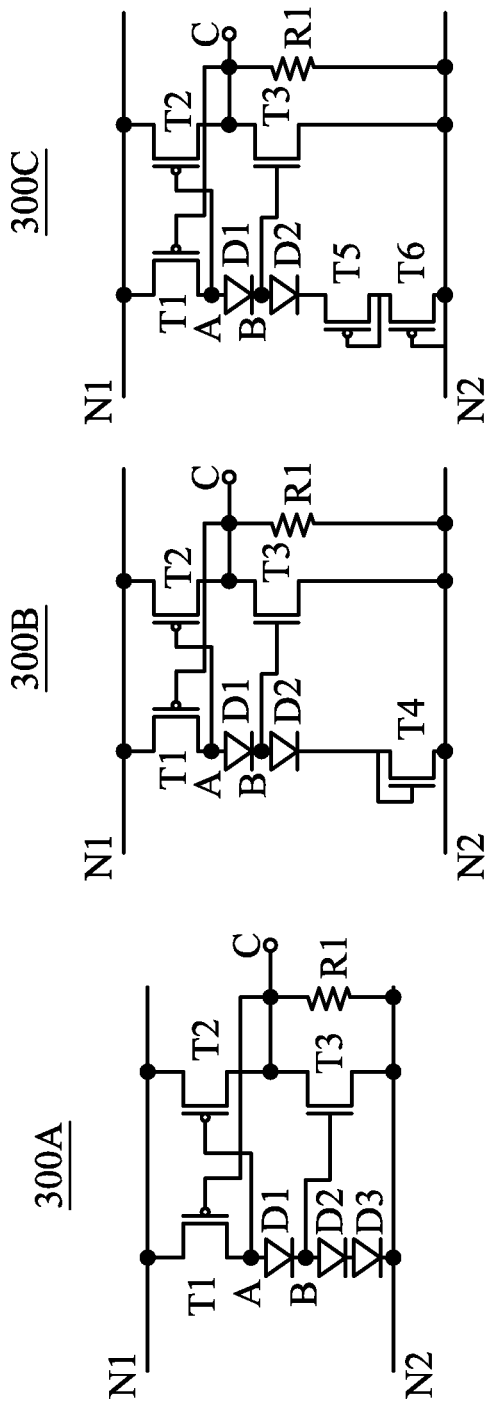
FIG. 3 is a diagram of voltage detectors, in accordance with some embodiments.

FIG. 3 is a diagram of voltage detectors, in accordance with some embodiments. Each one of voltage detectors 300A, 300B, and 300C is usable as voltage detector 110 of power clamp circuit 100 or power clamp circuit 200, discussed above with respect to FIGS. 1 and 2, respectively.

Each one of voltage detectors 300A, 300B, and 300C is coupled between first supply node N1 and second supply node N2. In each voltage detector, PMOS transistors T1 and T2 have source terminals electrically connected to first supply node N1. A gate terminal of transistor T2 is electrically connected to a drain terminal of transistor T1 at a node A, and a gate terminal of transistor T1 is electrically connected to a drain terminal of transistor T2 at an output node C. In some embodiments, output node C corresponds to output node 112 of voltage detector 110.

In each voltage detector, a diode D1 has an anode electrically connected to node A and a cathode electrically connected to a node B. In some embodiments, diode D1 is a transistor configured as a diode. An NMOS transistor T3 has a drain terminal electrically connected to output node C, a source terminal electrically connected to second supply node N2, and a gate terminal electrically connected to node B. A resistor R1 has a first terminal electrically connected to output node C and a second terminal electrically connected to second supply node N2.

In each voltage detector, one or more elements are coupled between node B and second supply node N2. In voltage detector 300A, the elements coupled between node B and second supply node N2 are a diode D2 in series with a diode D3. An anode of diode D2 is electrically connected to node B and a cathode of diode D3 is electrically connected to second supply node N2.

In voltage detector 300B, the elements coupled between node B and second supply node N2 are diode D2 in series with an NMOS transistor T4. The anode of diode D2 is electrically connected to node B. NMOS transistor T4 is configured as a diode with each of a gate terminal and drain terminal electrically connected to a cathode of diode D2 and a source terminal electrically connected to second supply node N2.

In voltage detector 300C, the elements coupled between node B and second supply node N2 are diode D2 in series with PMOS transistors T5 and T6. The anode of diode D2 is electrically connected to node B. Each transistor of the series of PMOS transistors is configured as a diode and is coupled between the cathode of diode D2 and second supply node N2. A source terminal of transistor T5 is electrically connected to the cathode of diode D2, and each of a drain terminal of transistor T6 and a gate terminal of transistor T6 is electrically connected to second supply node N2.

In each one of voltage detector 300A, voltage detector 300B, and voltage detector 300C, the two or more elements coupled between node B and second supply node N2 are chosen so that a voltage at node A sufficient to forward bias diode D1 and the one or more elements is greater than the first DC voltage value on first supply node N1 relative to the second DC voltage value on second supply node N2 during steady state operation or while powering up or powering down.

For each voltage detector, during steady state operation of functional circuits connected to supply node N1, current through resistor R1 is substantially zero and second supply node N2 drives output supply node C to the second DC voltage value, thereby generating the second DC voltage value on output node C. The gate terminal of transistor T1 therefore also has the second DC voltage value. Because the source terminal of transistor T1 has the first DC voltage value, transistor T1 is switched on and node A has the first DC voltage value.

Because both node A and first supply node N1 have the first DC voltage value during steady state, transistor T2 is switched off, thereby preventing current from flowing from first supply node N1 to second supply node N2 through resistor R1. Because node A has the first DC voltage value equal to or less than a voltage sufficient to forward bias diode D1 and the two or more elements coupled between node B and second supply node N2, diode D1 and the two or more elements are switched off and no significant leakage current flows between first supply node N1 and second supply node N2.

Each of voltage detector 300A, voltage detector 300B, and voltage detector 300C is thereby configured so that, in steady state operation, output node C is driven by second supply node N2 so that the second DC voltage value is generated at output node C.

In operation, a first supply voltage value above a steady state value pulls the voltage at node A toward a value that forward biases diode D1 and the two or more elements coupled between node B and second supply node N2. This forward-bias value defines a clamp, or reference, voltage value for the gate terminal of transistor T2 electrically connected to node A. Because the source terminal of transistor T2 is electrically connected to first supply node N1, a first supply voltage value that exceeds the reference voltage value by at least a threshold voltage of transistor T2 causes transistor T2 to be switched on.

Transistor T2 is selected to have a greater drive capacity than the drive capacity of transistor T3. When transistor T2 is switched on, output node C is therefore driven toward the first supply voltage value on first supply node N1 instead of the second supply voltage value on second supply node N2. Output node C being driven toward the first supply voltage value causes transistor T1 to be switched off, thereby causing each of node A and node B to have the second supply voltage value so that transistor T3 is switched off. With transistor T2 switched on and transistor T3 switched off, output node C is driven by first supply node N1, and the first supply voltage value is generated on output node C.

Selection of the elements coupled between node A and second supply node N2 determines the reference voltage value of node A and the gate terminal of transistor T2. With the source terminal of transistor T2 electrically connected to first supply node N1, the reference voltage and the threshold voltage of transistor T2 form the basis for a predetermined threshold voltage value at which each voltage detector, in operation, changes the value of the voltage generated at output node C. In some embodiments, transistor T2 has a threshold voltage that ranges from 0.5 V-1.5 V.

In voltage detector 300A, the series of diodes D1, D2, and D3 defines a reference voltage value for node A based on three forward biased diodes. In some embodiments, each of diodes D1, D2, and D3 has a forward bias threshold of 0.6 V-0.7 V and the reference voltage value ranges from 1.8 V-2.1 V. In some embodiments, the predetermined threshold voltage value based on the reference voltage value and the threshold voltage of transistor T2 ranges from 2.3 V-3.6 V. In various embodiments, voltage detector 300A is a component of a power clamp circuit in which a first DC voltage value on first supply node N1 and a second DC voltage value on second supply node N2 differ by 0.8 V or 1.8 V in steady state operation.

In voltage detector 300B, the series of diode D1, D2, and transistor T4 defines a reference voltage value for node A based on two forward biased diodes and one transistor configured as a diode. In some embodiments, each of diodes D1 and D2 and transistor T4 has a forward bias threshold of 0.6 V-0.7 V and the reference voltage value ranges from 1.8 V-2.1 V. In some embodiments, the predetermined threshold voltage value based on the reference voltage value and the threshold voltage of transistor T2 ranges from 2.3 V-3.6 V. In various embodiments, voltage detector 300B is a component of a power clamp circuit in which a first DC voltage value on first supply node N1 and a second DC voltage value on second supply node N2 differ by 0.8 V or 1.8 V in steady state operation.

In voltage detector 300C, the series of diode D1, D2, and transistors T5 and T6 defines a reference voltage value for node A based on two forward biased diodes and two transistors configured as diodes. In some embodiments, each of diodes D1 and D2 and transistors T5 and T6 has a forward bias threshold of 0.6 V-0.7 V and the reference voltage value ranges from 2.4 V-2.8 V. In some embodiments, the predetermined threshold voltage value based on the reference voltage value and the threshold voltage of transistor T2 ranges from 2.9 V-4.3 V. In various embodiments, voltage detector 300C is a component of a power clamp circuit in which a first DC voltage value on first supply node N1 and a second DC voltage value on second supply node N2 differ by 0.8 V or 1.8 V in steady state operation.

Voltage detectors 300A, 300B, and 300C are non-limiting examples of voltage detectors usable as voltage detector 110 in power clamp circuit 100 or power clamp circuit 200. Other voltage detectors having other configurations and other ranges of predetermined threshold voltage values are within the scope of the present disclosure.

Figure 4:
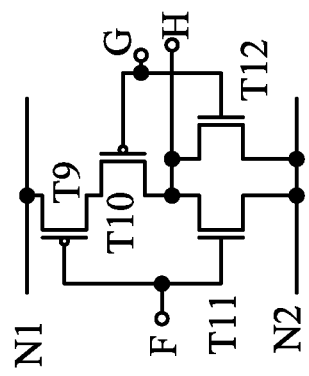
FIG. 4 is a diagram of drive circuits, in accordance with some embodiments.
Figure 4:
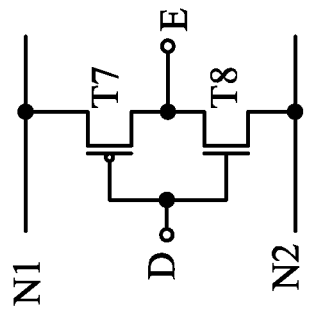

FIG. 4 is a diagram of drive circuits 400A and 400B, in accordance with some embodiments. Each of drive circuit 400A and drive circuit 400B is coupled between first supply node N1 and second supply node N2.

Drive circuit 400A includes a single input node D and a single output node E. Drive circuit 400A is usable as drive circuit 120 of power clamp circuit 100, discussed above with respect to FIG. 1. In some embodiments, input node D corresponds to input node 122 of drive circuit 120 and output node E corresponds to output node 124 of drive circuit 120.

Drive circuit 400A is configured as an inverter including a PMOS transistor T7 in series with an NMOS transistor T8. A source terminal of transistor T7 is electrically connected to first supply node N1 and a source terminal of transistor T8 is electrically connected to second supply node N2. Input node D is electrically connected to a gate terminal of transistor T7 and to a gate terminal of transistor T8. A drain terminal of transistor T7 is electrically connected to a drain terminal of transistor T8 and to output node E.

Drive circuit 400A is thereby configured so that, in operation, a voltage on input node D having a high logic value causes a voltage having a low logic value to be generated on output node E, and a voltage on input node D having a low logic value causes a voltage having a high logic value to be generated on output node E.

Drive circuit 400B includes a first input node F, a second input node G, and a single output node H. Drive circuit 400B is usable as drive circuit 220 of power clamp circuit 200, discussed above with respect to FIG. 2. In some embodiments, input node F corresponds to input node 222 of drive circuit 220, input node G corresponds to input node 224 of drive circuit 220, and output node H corresponds to output node 226 of drive circuit 220.

Drive circuit 400B is configured as a NOR gate including a PMOS transistor T9 in series with a PMOS transistor T10 and with a parallel combination of an NMOS transistor T11 and an NMOS transistor T12. A source terminal of transistor T9 is electrically connected to first supply node N1, a source terminal of transistor T11 is electrically connected to second supply node N2, and a source terminal of transistor T12 is electrically connected to second supply node N2.

Input node F is electrically connected to a gate terminal of transistor T9 and to a gate terminal of transistor T11. Input node G is electrically connected to a gate terminal of transistor T10 and to a gate terminal of transistor T12. A drain terminal of transistor T9 is electrically connected to a source terminal of transistor T10. A drain terminal of transistor T10, a drain terminal of transistor T11, and a drain terminal of transistor T12 are electrically connected to output node H.

Drive circuit 400B is thereby configured so that, in operation, a voltage on input node F having a high logic value and/or a voltage on input node G having a high logic value causes a voltage having a low logic value to be generated on output node H. In operation, a voltage on input node F having a low logic value and a voltage on input node G having a low logic value causes a voltage having a high logic value to be generated on output node H.

Drive circuits 400A and 400B are non-limiting examples of drive circuits usable in power clamp circuit 100 or power clamp circuit 200. Other drive circuits having other configurations are within the scope of the present disclosure. For example, in some embodiments, a drive circuit includes more than two input nodes and/or more than one output node. In some embodiments, a drive circuit includes one or more logic gates, e.g. OR, AND, or NAND gates, as alternatives or additions to the logic gates of drive circuits 400A and 400B.

Figure 5:
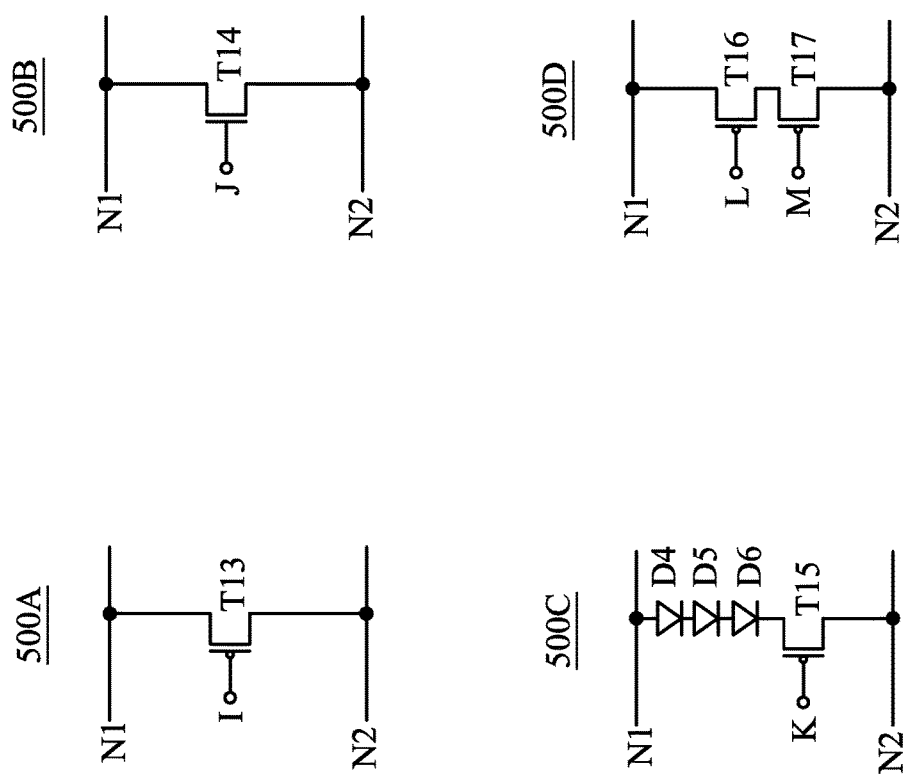
FIG. 5 is a diagram of clamp circuits, in accordance with some embodiments.

FIG. 5 is a diagram of clamp circuits, in accordance with some embodiments. Each of clamp circuits 500A, 500B, 500C, and 500D is usable as clamp circuit 130 of power clamp circuit 100 or power clamp circuit 200, discussed above with respect to FIGS. 1 and 2, respectively.

Each of clamp circuits 500A, 500B, 500C, and 500D is coupled between first supply node N1 and second supply node N2 and is configured to selectively establish a current path between first supply node N1 and second supply node N2 responsive to a control voltage at one or more input nodes.

Clamp circuit 500A includes a PMOS transistor T13 having a source terminal electrically connected to first supply node N1, a drain terminal electrically connected to second supply node N2, and a gate terminal electrically connected to an input node I. In some embodiments, input node I corresponds to input node 132 of clamp circuit 130.

Clamp circuit 500B includes an NMOS transistor T14 having a drain terminal electrically connected to first supply node N1, a source terminal electrically connected to second supply node N2, and a gate terminal electrically connected to an input node J. In some embodiments, input node J corresponds to input node 132 of clamp circuit 130.

Clamp circuit 500C includes a PMOS transistor T15 in series with diodes D4, D5, and D6. An anode of diode D4 is electrically connected to first supply node N1, a drain terminal of transistor T15 is electrically connected to second supply node N2, and diodes D5 and D6 are electrically connected in series between diode D4 and transistor T15. A gate terminal of transistor T15 is electrically connected to an input node K. In some embodiments, input node K corresponds to input node 132 of clamp circuit 130.

Clamp circuit 500D includes a PMOS transistor T16 having a source terminal electrically connected to first supply node N1 in series with a PMOS transistor T17 having a drain terminal electrically connected to second supply node N2. A gate terminal of transistor T16 is electrically connected to a first input node L and a gate terminal of transistor T17 is electrically connected to a second input node M.

Clamp circuits 500A, 500B, 500C, and 500D are non-limiting examples of clamp circuits usable as clamp circuit 130 in power clamp circuit 100 or power clamp circuit 200. Other clamp circuits having other configurations for selectively establishing a current path between first supply node N1 and second supply node N2 responsive to a control voltage at one or more input nodes are within the scope of the present disclosure.

Figure 6:
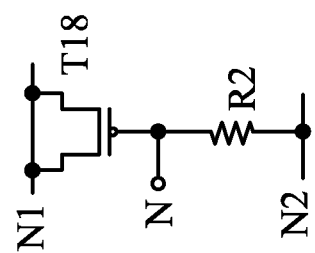
FIG. 6 is a diagram of a transient detector, in accordance with some embodiments.

FIG. 6 is a diagram of a transient detector 600, in accordance with some embodiments. Transient detector 600 is usable as transient detector 240 of power clamp circuit 200, discussed above with respect to FIG. 2.

Transient detector 600 is coupled between first supply node N1 and second supply node N2 and includes a transistor T18 in series with a resistor R2. Transistor T18 is configured as a capacitor by having a source terminal and a drain terminal electrically connected to first supply node N1 such that transistor T18 and resistor R2 form an RC circuit. A gate terminal of transistor T18 is electrically connected to a first terminal of resistor R2 and to an output node N, and a second terminal of resistor R2 is electrically connected to second supply node N2. In some embodiments, output node N corresponds to output node 242 of transient detector 240.

In steady state operation, a capacitance of transistor T18 is charged so that the source and drain terminals of transistor T18 have the first supply voltage present on first supply node N1. No significant current flows through resistor R2, so output node N has the second supply voltage present on second supply node N2. In operation, a change in the first supply voltage having a rate of change that exceeds a predetermined threshold change value, as discussed below, causes node N to be coupled with first supply node N1 so that the first supply voltage is presented on node N.

Selection of a capacitance value of transistor T18 in combination with a resistance value of resistor R2 causes transient detector 600 to have a predetermined threshold change value. A rate of change of the difference between the first supply voltage and the second supply voltage that exceeds the predetermined threshold change value causes transient detector 600 to generate the first supply voltage on output node N. A rate of change of the difference between the first supply voltage and the second supply voltage that is equal to or less than the predetermined threshold change value causes transient detector 600 to generate the second supply voltage on output node N.

Transient detector 600 is a non-limiting example of a transient detector usable as transient detector 240 in power clamp circuit 200. Other transient detectors having other configurations are within the scope of the present disclosure.

Figure 7A:
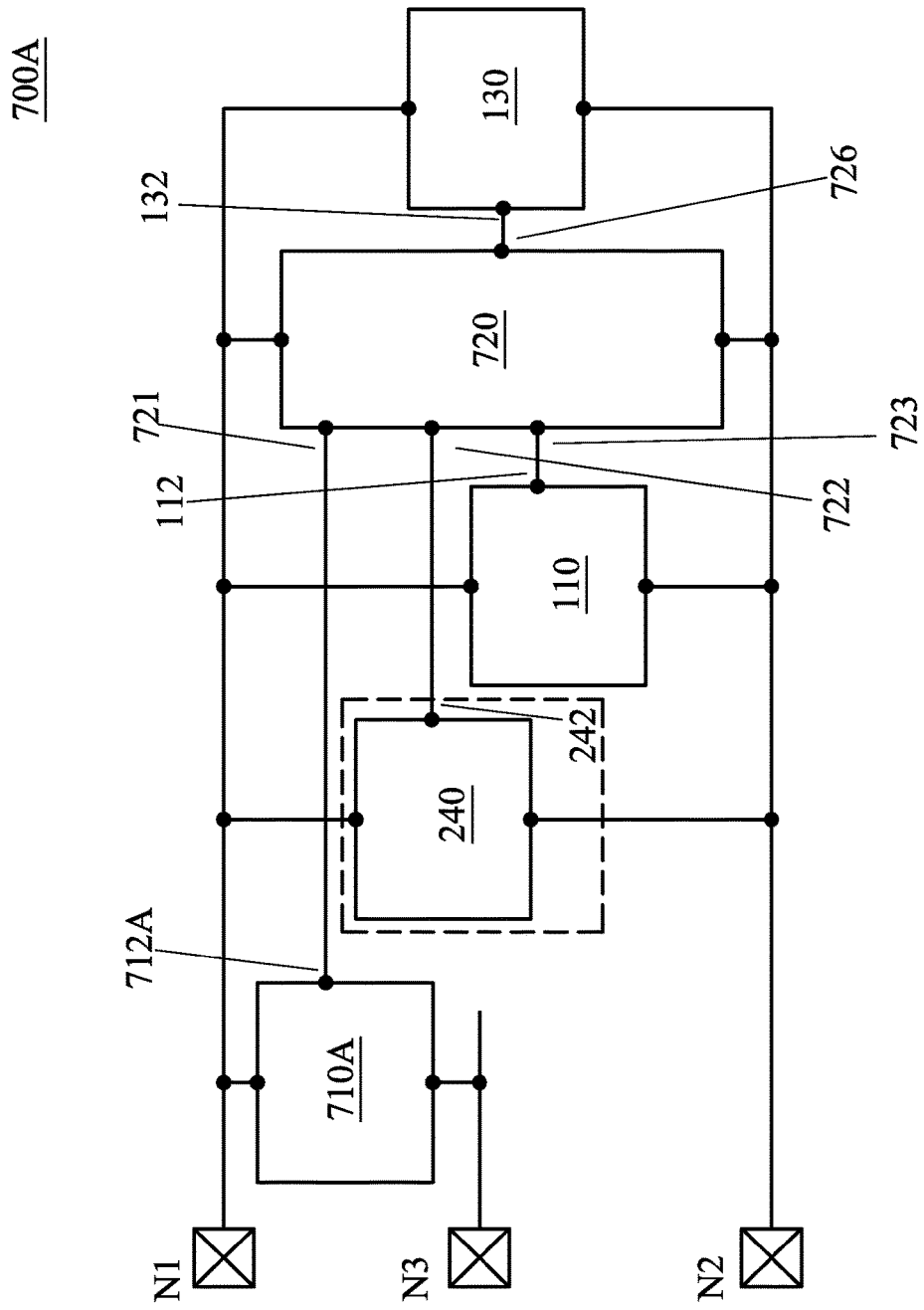
FIG. 7A-7C are diagrams of a power clamp circuits, in accordance with some embodiments.

FIG. 7A is a diagram of a power clamp circuit 700A, in accordance with some embodiments. Power clamp circuit 700A includes first supply node N1, second supply node N2, voltage detector 110, clamp circuit 130, and, in some embodiments, transient detector 240, each of which is discussed above with respect to power clamp circuit 100 and power clamp circuit 200. In contrast to power clamp circuit 100, power clamp circuit 700A does not include drive circuit 120. Power clamp circuit 700A also includes a third supply node N3, a voltage detector 710A coupled between first supply node N1 and third supply node N3, and a drive circuit 720 coupled between first supply node N1 and second supply node N2. Voltage detector 710A includes an output node 712A, and drive circuit 720 includes a first input node 721 coupled with output node 712A of voltage detector 710A, a second input node 722 coupled with output node 242 of transient detector 240, a third input node 723 coupled with output node 112 of voltage detector 110, and an output node 726 coupled with input node 132 of clamp circuit 130. In some embodiments, power clamp circuit 700A does not include transient detector 240, output node 242 of transient detector 240, or second input node 722 of drive circuit 720.

Third supply node N3 is configured to have a third supply voltage. In steady state operation, the third supply voltage has a third DC voltage value between the first DC voltage value and the second DC voltage value, discussed above with respect to power clamp circuit 100. In some embodiments, the first DC voltage value is VDDIO of a first functional circuit coupled with first supply node N1 and second supply node N2, and the third DC voltage value is VDDCORE of a second functional circuit coupled with third supply node N3 and second supply node N2. In some embodiments, VDDIO has a nominal value of 1.8 V. In some embodiments, VDDCORE has a nominal value of 0.8 V.

Voltage detector 710A is configured to operate similarly to voltage detector 110, described above with respect to power clamp circuit 100, but operates based on a second predetermined threshold voltage value different from the first predetermined threshold voltage value of voltage detector 110. Accordingly, if a difference between the first supply voltage and the third supply voltage is equal to or less than the second predetermined threshold voltage value, voltage detector 710A is configured to output a first output voltage value to output node 712A. If the difference between the first supply voltage and the third supply voltage exceeds the second predetermined threshold voltage value, voltage detector 710A is configured to output a second output voltage value to output node 712A different from the first output voltage value.

By selecting the second predetermined threshold voltage value larger than a difference between the first DC voltage value and the third DC voltage value, voltage detector 710A is configured to detect an EOS event. In operation, during steady state or while powering up or powering down, the difference between the first DC voltage value and the third DC voltage value is equal to or below the second predetermined threshold voltage value, so voltage detector 710A outputs the first output voltage value. During an EOS event, in operation, the first supply voltage can have a value relative to the third supply voltage that is above the second predetermined threshold voltage value, so voltage detector 710A outputs the second output voltage value.

Drive circuit 720 is configured to generate the control voltage on output node 726 in response to the output voltage on node 712A of voltage detector 710A, the output voltage on node 242 of transient detector 240, and the output voltage on node 112 of voltage detector 110. Drive circuit 720 is configured to generate the control voltage having the first control voltage value if the output voltage value on node 112 corresponds to detection of a first supply voltage difference above the first predetermined threshold voltage value, if the output voltage value on node 242 corresponds to detection of the rate of change of the first supply voltage difference exceeding the threshold change value, or if the output voltage value on node 712A corresponds to detection of a second supply voltage difference above the second threshold voltage value. Drive circuit 720 is configured to generate the control voltage having the second control voltage value if the output voltage value on node 112 corresponds to detection of a first supply voltage difference equal to or below the first predetermined threshold voltage value, the output voltage value on node 242, corresponds to detection of the rate of change of the first supply voltage difference being equal to or below the threshold change value, and the output voltage value on node 712A corresponds to detection of a second supply voltage difference equal to or below the second threshold voltage value.

In some embodiments, power clamp circuit 700A does not include transient detector 240, and drive circuit 720 is configured to generate the control voltage on output node 726 in response to the output voltage on node 712A of voltage detector 710A and the output voltage on node 112 of voltage detector 110. In some embodiments, drive circuit 720 is configured to generate the control voltage having the first control voltage value if the output voltage value on node 112 corresponds to detection of a first supply voltage difference above the first predetermined threshold voltage value or if the output voltage value on node 712A corresponds to detection of a second supply voltage difference above the second threshold voltage value. In some embodiments, drive circuit 720 is configured to generate the control voltage having the second control voltage value if the output voltage value on node 112 corresponds to detection of a first supply voltage difference equal to or below the first predetermined threshold voltage value and the output voltage value on node 712A corresponds to detection of a second supply voltage difference equal to or below the second threshold voltage value.

Figure 7B:
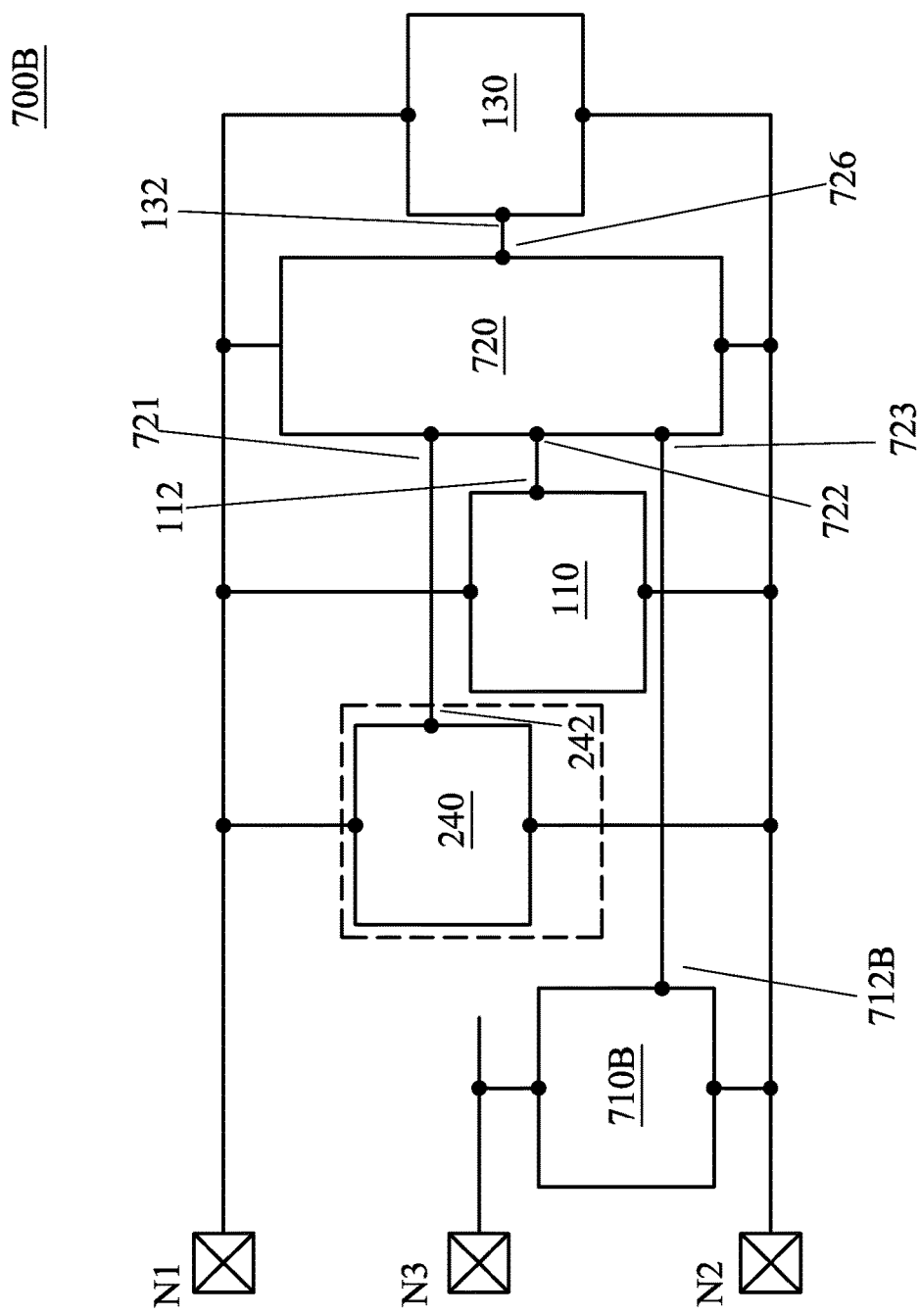

FIG. 7B is a diagram of a power clamp circuit 700B, in accordance with some embodiments. Power clamp circuit 700B includes first supply node N1, second supply node N2, third supply node N3, voltage detector 110, drive circuit 720, clamp circuit 130, and, in some embodiments, transient detector 240, each of which is discussed above with respect to power clamp circuit 700A. Instead of voltage detector 710A, power clamp circuit 700B includes a voltage detector 710B coupled between third supply node N3 and second supply node N2. Voltage detector 710B includes an output node 712B, and drive circuit 720 includes first input node 721 coupled with output node 242 of transient detector 240, second input node 722 coupled with output node 112 of voltage detector 110, third input node 723 coupled with output node 712B of voltage detector 710B, and output node 726 coupled with input node 132 of clamp circuit 130. In some embodiments, power clamp circuit 700B does not include transient detector 240, output node 242 of transient detector 240, or second input node 722 of drive circuit 720.

Voltage detector 710B is configured to operate similarly to voltage detector 110, described above with respect to power clamp circuit 100, but operates based on a third predetermined threshold voltage value different from the first predetermined threshold voltage value of voltage detector 110. Accordingly, if a difference between the third supply voltage and the second supply voltage is equal to or less than the third predetermined threshold voltage value, voltage detector 710B is configured to output a first output voltage value to output node 712B. If the difference between the third supply voltage and the second supply voltage exceeds the third predetermined threshold voltage value, voltage detector 710B is configured to output a second output voltage value to output node 712B different from the first output voltage value.

In some embodiments, the third predetermined threshold voltage value is different from the second predetermined threshold voltage value. In some embodiments, the third predetermined threshold voltage value is the same as the second predetermined threshold voltage value.

Figure 7C:
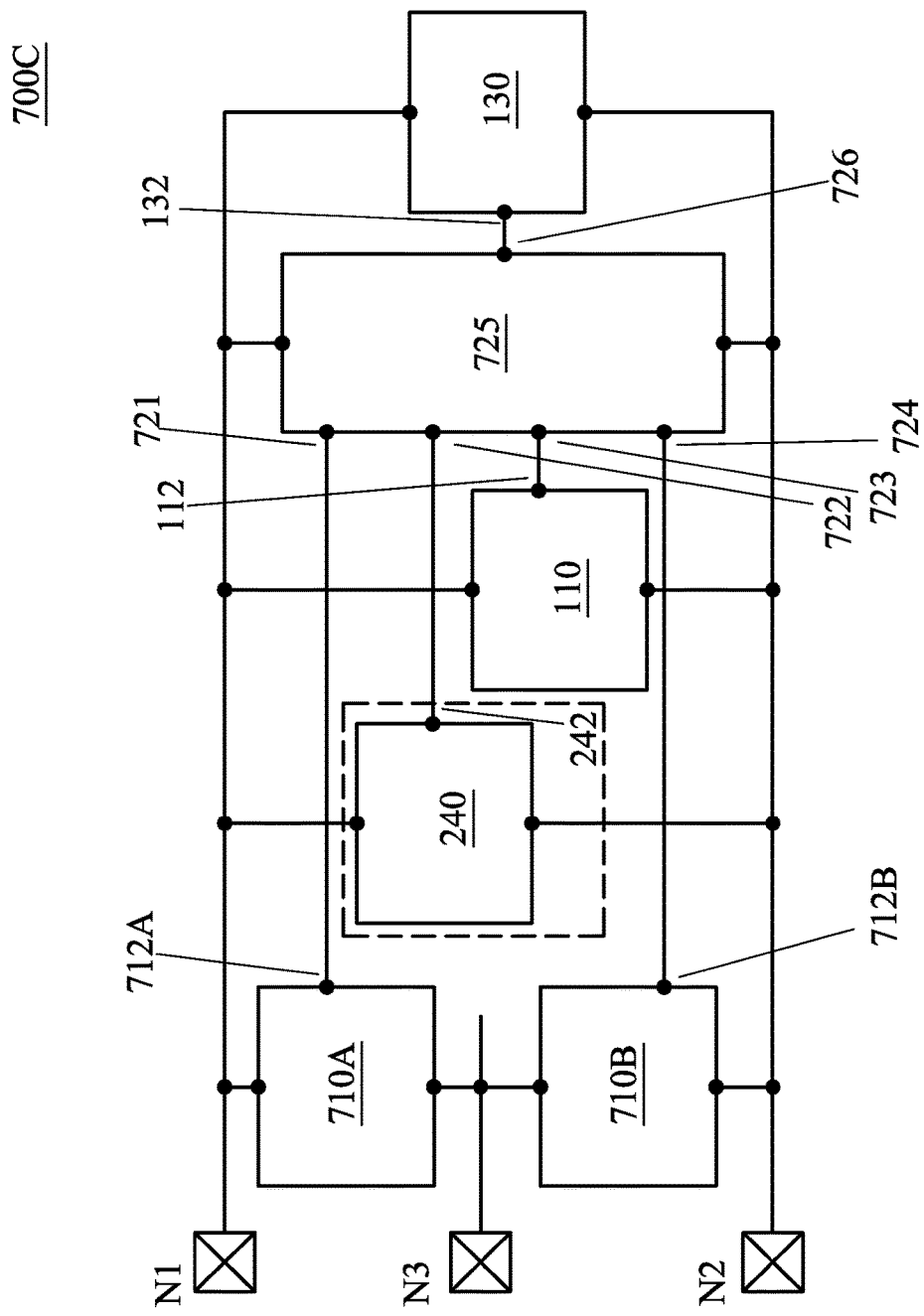

FIG. 7C is a diagram of a power clamp circuit 700C, in accordance with some embodiments. Power clamp circuit 700C includes first supply node N1, second supply node N2, third supply node N3, voltage detector 110, voltage detector 710A, voltage detector 710B, clamp circuit 130, and, in some embodiments, transient detector 240, each of which is discussed above with respect to power clamp circuits 700A and 700B. Instead of drive circuit 720, power clamp circuit 700C includes drive circuit 725 coupled between first supply node N1 and second supply node N2. Drive circuit 725 includes first input node 721 coupled with output node 710A of voltage detector 710A, second input node 722 coupled with output node 242 of transient detector 240, third input node 723 coupled with output node 112 of voltage detector 110, fourth input node 724 coupled with output node 712B of voltage detector 710B, and output node 726 coupled with input node 132 of clamp circuit 130. In some embodiments, power clamp circuit 700C does not include transient detector 240, output node 242 of transient detector 240, or second input node 722 of drive circuit 725.

Drive circuit 725 is configured to generate the control voltage on output node 726 in response to the output voltage on node 712A of voltage detector 710A, the output voltage on node 242 of transient detector 240, the output voltage on node 112 of voltage detector 110, and the output voltage on node 712B of voltage detector 710B. Drive circuit 725 is configured to generate the control voltage having the first control voltage value if the output voltage value on node 112 corresponds to detection of a first supply voltage difference above the first predetermined threshold voltage value, if the output voltage value on node 242 corresponds to detection of the rate of change of the first supply voltage difference exceeding the threshold change value, if the output voltage value on node 712A corresponds to detection of a second supply voltage difference above the second threshold voltage value, or if the output voltage value on node 712B corresponds to detection of a third supply voltage difference above the third threshold voltage value. Drive circuit 725 is configured to generate the control voltage having the second control voltage value if the output voltage value on node 112 corresponds to detection of the first supply voltage difference equal to or below the first predetermined threshold voltage value, the output voltage value on node 242 corresponds to detection of the rate of change of the first supply voltage difference being equal to or below the threshold change value, the output voltage value on node 712A corresponds to detection of the second supply voltage difference equal to or below the second threshold voltage value, and the output voltage value on node 712B corresponds to detection of the third supply voltage difference equal to or below the third threshold voltage value.

In some embodiments, power clamp circuit 700A does not include transient detector 240, and drive circuit 725 is configured to generate the control voltage on output node 726 in response to the output voltage on node 712A of voltage detector 710A, the output voltage on node 112 of voltage detector 110, and the output voltage on node 712B of voltage detector 710B. In some embodiments, drive circuit 725 is configured to generate the control voltage having the first control voltage value if the output voltage value on node 112 corresponds to detection of a first supply voltage difference above the first predetermined threshold voltage value, if the output voltage value on node 712A corresponds to detection of a second supply voltage difference above the second threshold voltage value, or if the output voltage value on node 712B corresponds to detection of a third supply voltage difference above the third threshold voltage value. In some embodiments, drive circuit 725 is configured to generate the control voltage having the second control voltage value if the output voltage value on node 112 corresponds to detection of the first supply voltage difference equal to or below the first predetermined threshold voltage value, the output voltage value on node 712A corresponds to detection of the second supply voltage difference equal to or below the second threshold voltage value, and the output voltage value on node 712B corresponds to detection of the third supply voltage difference equal to or below the third threshold voltage value.

Each of power clamp circuits 700A, 700B, and 700C is configured to respond to EOS and ESD events similarly to power clamp circuit 100 and power clamp circuit 200. By including voltage detector 710A and/or voltage detector 710B and drive circuit 720 or drive circuit 725 responsive to voltage detector 710A and/or voltage detector 710B, each of power clamp circuits 700A, 700B, and 700C is configured to respond to an EOS event on a circuit including third supply node N3.

Power clamp circuits 700A, 700B, and 700C are non-limiting examples of power clamp circuits for circuit configurations including three supply nodes. Other power clamp circuits having similar configurations based on voltage detectors for circuit configurations including more than three supply nodes are within the scope of the present disclosure.

Figure 8:
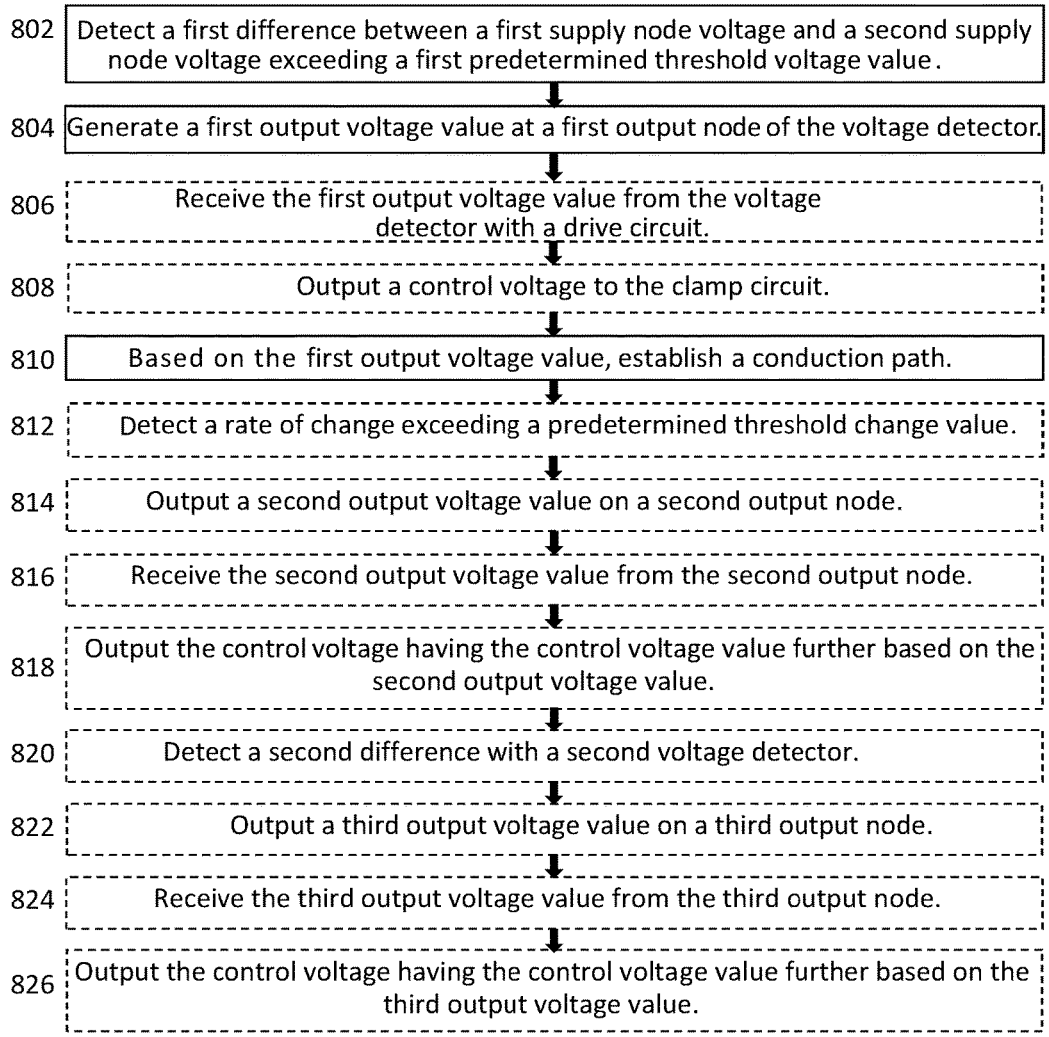
FIG. 8 is a flow chart of a method of operating a power clamp circuit, in accordance with some embodiments.

FIG. 8 is a flow chart of a method 800 of operating a power clamp circuit, in accordance with some embodiments. Method 800 is capable of being performed with any of power clamp circuits 100, 200, 700A, 700B, and 700C, as discussed above.

At operation 802, a voltage detector detects a first difference between a first supply node voltage and a second supply node voltage exceeding a first predetermined threshold voltage value. In various embodiments, the voltage detector is one of voltage detectors 110, 100A, 300B, or 300C described above with respect to power clamp circuits 100, 200, 700A, 700B, and 700C. In various embodiments, the first supply node voltage is a supply node voltage on first supply node N1 and the second supply node voltage is a supply node voltage on second supply node N2 described above with respect to power clamp circuits 100, 200, 700A, 700B, and 700C.

At operation 804, in response to the detecting the first difference exceeding the first predetermined threshold value, the voltage detector generates a first output voltage value at a first output node of the voltage detector. In some embodiments, generating the first output voltage value comprises driving the first output node to the first supply node voltage. In some embodiments, a first supply node having the first supply node voltage is first supply node N1. In some embodiments, driving the first output node to the first supply node voltage comprises electrically connecting the first output node to the first supply node with a switch. In some embodiments, driving the first output node to the first supply node voltage comprises electrically connecting the first output node to the first supply node with a PMOS transistor.

At operation 806, in some embodiments, a drive circuit receives the first output voltage value from the voltage detector. In various embodiments, the first output voltage value is received by one of drive circuits 120, 220, 400A, or 400B described above with respect to power clamp circuits 100, 200, 700A, 700B, and 700C.

At operation 808, in some embodiments, the drive circuit outputs a control voltage to the clamp circuit, the control voltage having a control voltage value based on the first output voltage value.

At operation 810, based on the first output voltage value at the first output node, a clamp circuit establishes a conduction path between the first supply node and a second supply node having the second supply node voltage. In some embodiments, the clamp circuit receives the first output voltage value from the voltage detector. In some embodiments, the clamp circuit receives the control voltage value from the drive circuit. In various embodiments, establishing the conduction path comprises establishing the conduction path with one of clamp circuits 130, 500A, 500B, 500C, or 500D described above with respect to power clamp circuits 100, 200, 700A, 700B, and 700C.

At operation 812, in some embodiments, a transient detector detects a rate of change of the difference between the first supply node voltage and the second supply node voltage exceeding a predetermined threshold change value. In various embodiments, the transient detector is one of transient detectors, 240 or 600 described above with respect to power clamp circuits 200, 700A, 700B, and 700C.

At operation 814, in some embodiments, in response to the detecting the rate of change exceeding the predetermined threshold change value, the transient detector outputs a second output voltage value on a second output node of the transient detector.

At operation 816, in some embodiments, the drive circuit receives the second output voltage value from the second output node of the transient detector.

At operation 818, in some embodiments, the drive circuit outputs the control voltage having the control voltage value further based on the second output voltage value.

At operation 820, in some embodiments, a second voltage detector detects a second difference between a third power supply node voltage and one of the first supply node voltage or the second supply node voltage exceeding a second predetermined threshold voltage value. In various embodiments, the second voltage detector is one of voltage detectors 710A or 710B and the third supply node voltage is the third supply node voltage on third supply node N3, described above with respect to power clamp circuits 700A, 700B, and 700C.

At operation 822, in some embodiments, in response to the detecting the second difference, the second voltage detector outputs a third output voltage value on a third output node of the second voltage detector.

At operation 824, in some embodiments, the drive circuit receives the third output voltage value from the third output node of the second voltage detector.

At operation 826, in some embodiments, the drive circuit outputs the control voltage having the control voltage value further based on the third output voltage value.

In some embodiments, a voltage detector includes a first node configured to have a first supply voltage, a second node configured to have a second supply voltage, and an output node. The voltage detector is configured to drive the output node to the first supply voltage in response to a difference between the first supply voltage and the second supply voltage exceeding a predetermined threshold voltage value.

In some embodiments, a voltage detection circuit includes a first node configured to have a first supply voltage, a second node configured to have a second supply voltage, a third node configured to have a third supply voltage, a first voltage detector coupled between the first node and the second node, the first voltage detector being configured to drive a first output node to the first supply voltage in response to a difference between the first supply voltage and the second supply voltage exceeding a first predetermined threshold voltage value, and a second voltage detector. The second voltage detector is either coupled between the first node and the third node and configured to drive a second output node to the first supply voltage in response to a difference between the first supply voltage and the third supply voltage exceeding a second predetermined threshold voltage, or is coupled between the third node and the second node and configured to drive the second output node to the third supply voltage in response to a difference between the third supply voltage and the second supply voltage exceeding a third predetermined threshold voltage.

In some embodiments, a method of operating a voltage detector circuit includes detecting a difference between a first supply voltage on a first supply node and a second supply voltage on a second supply node exceeding a first predetermined threshold voltage value, and, in response to the detecting the difference exceeding the first predetermined threshold value, generating a first output voltage value by driving a first output node of the voltage detector to the first supply voltage.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A voltage detector comprising:
a first node configured to have a first supply voltage;
a second node configured to have a second supply voltage; and
an output node,
wherein
the voltage detector is configured to, in response to a difference between the first supply voltage and the second supply voltage exceeding a predetermined threshold voltage value, switch off an electrical connection between the output node and the second node, and drive the output node to the first supply voltage.

2. The voltage detector of claim 1, further comprising a switch coupled between the first node and the output node.

3. The voltage detector of claim 2, wherein the switch comprises a p-type metal oxide semiconductor (PMOS) transistor.

4. The voltage detector of claim 2, further comprising a reference node configured to have a reference voltage value based on the predetermined threshold voltage value, wherein the switch comprises a control terminal coupled with the reference node.

5. The voltage detector of claim 4, wherein the reference node is configured to have the reference voltage value greater than a steady state value of the first supply voltage.

6. The voltage detector of claim 4, wherein the reference node is configured to have the reference voltage value of the predetermined threshold voltage value minus a threshold voltage of the switch.

7. The voltage detector of claim 4, further comprising a diode coupled between the reference node and the second node, wherein the reference voltage value is based on a forward bias threshold of the diode.

8. The voltage detector of claim 7, further comprising at least one of another diode or a transistor configured as a diode in series with the diode, wherein the reference voltage value is further based on a forward bias threshold of the at least one of the another diode or the transistor configured as a diode.

9. The voltage detector of claim 1, wherein the voltage detector is configured to drive the output node to the second supply voltage in response to the difference between the first supply voltage and the second supply voltage being less than or equal to the predetermined threshold voltage value.

10. The voltage detector of claim 1, wherein:
the first supply voltage has a predetermined steady state direct current (DC) value corresponding to a functional circuit coupled with the first node,
the second supply voltage is a ground reference voltage of the functional circuit, and
the voltage detector and the functional circuit are components of a single integrated circuit (IC) chip.

11. A voltage detection circuit comprising:
a first node configured to have a first supply voltage;
a second node configured to have a second supply voltage;
a third node configured to have a third supply voltage;
a first voltage detector coupled between the first node and the second node, the first voltage detector being configured to drive a first output node to the first supply voltage in response to a difference between the first supply voltage and the second supply voltage exceeding a first predetermined threshold voltage value; and
a second voltage detector either:
coupled between the first node and the third node and configured to drive a second output node to the first supply voltage in response to a difference between the first supply voltage and the third supply voltage exceeding a second predetermined threshold voltage, or
coupled between the third node and the second node and configured to drive the second output node to the third supply voltage in response to a difference between the third supply voltage and the second supply voltage exceeding a third predetermined threshold voltage.

12. The voltage detection circuit of claim 11, wherein:
the first supply voltage has a first predetermined steady state direct current (DC) value corresponding to a first functional circuit coupled with the first node,
the second supply voltage is a ground reference voltage, and
the third supply voltage has a second predetermined steady state DC value between the first DC value and the ground reference voltage, and corresponding to a second functional circuit coupled with the third node.

13. The voltage detection circuit of claim 12, wherein the first voltage detector, the second voltage detector, the first functional circuit, and the second functional circuit are components of a single integrated circuit (IC) chip.

14. The voltage detection circuit of claim 11, wherein:
the second voltage detector is coupled between the first node and the third node, and
the voltage detection circuit comprises a third voltage detector coupled between the third node and the second node and configured to drive a third output node to the third supply voltage in response to the difference between the third supply voltage and the second supply voltage exceeding the third predetermined threshold voltage.

15. A method of operating a voltage detector circuit, the method comprising:
detecting a difference between a first supply voltage on a first supply node and a second supply voltage on a second supply node exceeding a first predetermined threshold voltage value; and
in response to the detecting the difference exceeding the first predetermined threshold value, generating a first output voltage value by switching off an electrical connection between a first output node of the voltage detector and the second supply node, and driving the first output node to the first supply voltage.

16. The method of claim 15, wherein the detecting the difference exceeding the predetermined threshold voltage value comprises forward biasing a diode to define a reference voltage value greater than a steady state value of the first supply voltage.

17. The method of claim 16, wherein the detecting the difference exceeding the predetermined threshold voltage value further comprises the first supply voltage exceeding the reference voltage value by a threshold voltage of a switch coupled between an anode of the diode and the first supply node.

18. The method of claim 15, wherein the driving the first output node of the voltage detector to the first supply voltage comprises turning on a p-type metal oxide semiconductor (PMOS) transistor coupled between the first output node and the first supply node.

19. The method of claim 15, further comprising, in response to the detecting the difference being less than or equal to the first predetermined threshold value, generating a second output voltage value by driving the first output node of the voltage detector to the second supply voltage.

20. The method of claim 15, further comprising at least one of:
- in response to the detecting a difference between the first supply voltage and a third supply voltage on a third supply node exceeding a second predetermined threshold voltage value, generating a second output voltage value by driving a second output node of the voltage detector to the first supply voltage; or
- in response to the detecting a difference between a third supply voltage on a third supply node and the second supply voltage exceeding the predetermined threshold voltage value, generating the second output voltage value by driving the second output node of the voltage detector to the third supply voltage.

* * * * *